US011436396B2

(12) United States Patent
Singh et al.

(10) Patent No.: US 11,436,396 B2
(45) Date of Patent: Sep. 6, 2022

(54) ESTIMATING REPLICATION COMPLETION TIME USING MACHINE LEARNING TECHNIQUES

(71) Applicant: EMC IP Holding Company LLC, Hopkinton, MA (US)

(72) Inventors: Jitendra Singh, Bangalore (IN); Rahul D. Vishwakarma, Bangalore (IN); Shelesh Chopra, Bangalore (IN)

(73) Assignee: EMC IP Holding Company LLC, Hopkinton, MA (US)

( * ) Notice: Subject to any disclaimer, the term of this patent is extended or adjusted under 35 U.S.C. 154(b) by 411 days.

(21) Appl. No.: 16/830,527

(22) Filed: Mar. 26, 2020

(65) Prior Publication Data

US 2021/0303761 A1 Sep. 30, 2021

(51) Int. Cl.
*G06F 30/27* (2020.01)
*G06F 11/14* (2006.01)
*G06F 17/15* (2006.01)
*G06K 9/62* (2022.01)
*G06F 16/174* (2019.01)
(Continued)

(52) U.S. Cl.
CPC .......... *G06F 30/27* (2020.01); *G06F 11/1453* (2013.01); *G06F 17/15* (2013.01); *G06K 9/6256* (2013.01); *G06K 9/6282* (2013.01); *G06N 20/00* (2019.01)

(58) Field of Classification Search
CPC ...... G06F 30/27; G06F 11/1453; G06F 17/15; G06F 16/1748; G06K 9/6256; G06K 9/6282; G06N 20/00; G06N 5/003
See application file for complete search history.

(56) References Cited

U.S. PATENT DOCUMENTS 10,223,232 B2 * 3/2019 Eckert ................ G06F 11/3476
2017/0017403 A1 * 1/2017 Sekine ................ G06F 3/0619
(Continued)

FOREIGN PATENT DOCUMENTS

WO   WO-2016200412 A1 * 12/2016 ....... G06F 17/30578

OTHER PUBLICATIONS

U.S. Appl. No. 16/656,875, filed Oct. 18, 2019.
Mourtada et al., AMF: Aggregated Mondrian Forests for Online Learning, Jun. 25, 2019.

*Primary Examiner* — Asghar H Bilgrami
(74) *Attorney, Agent, or Firm* — Ryan, Mason & Lewis, LLP

(57) ABSTRACT

Methods, apparatus, and processor-readable storage media for estimating replication completion time using machine learning techniques are provided herein. An example computer-implemented method includes obtaining, from one or more data deduplication storage systems, data related to one or more historical replication operations; generating at least one curve fitting function by processing at least a portion of the obtained data using one or more machine learning techniques; generating an estimate for completion time of at least one unexecuted replication operation associated with at least one of the one or more data deduplication storage systems by processing input data from the at least one data deduplication storage system using the at least one curve fitting function; and performing one or more automated actions based at least in part on the generated estimate.

20 Claims, 6 Drawing Sheets

(51) Int. Cl.
*G06N 20/00* (2019.01)
*G06N 5/00* (2006.01)

(56) References Cited

U.S. PATENT DOCUMENTS

2018/0011913 A1* 1/2018 Kapanipathi ......... G06F 16/273
2021/0026982 A1* 1/2021 Amarendran ....... G06F 21/6245

* cited by examiner

ESTIMATING REPLICATION COMPLETION TIME USING MACHINE LEARNING TECHNIQUES

FIELD

The field relates generally to information processing systems, and more particularly to data replication in such systems.

BACKGROUND

Enterprises commonly make numerous decisions based on the performance and timing of computing operations. For example, an enterprise may replicate data from a production data center to a disaster recovery data center, and in the event of a disaster at the production site, applications can be started at the disaster recovery site using the data that has been replicated to that site so that the enterprise can continue its business. Data replication in these and other contexts can be implemented using asynchronous replication at certain times and synchronous replication at other times. For example, asynchronous replication may be configured to periodically transfer data in multiple cycles from a source site to a target site, while synchronous replication may be configured to mirror host writes from the source site to the target site as the writes are made at the source site.

However, estimating the completion time of data replication operations faces challenges. In the context of data deduplication, for instance, it can be difficult to estimate the completion time of replication operations using limited information. Moreover, conventional replication completion estimation approaches commonly utilize offline techniques that fail to produce accurate estimation results without the availability of entire datasets.

SUMMARY

Illustrative embodiments of the disclosure provide techniques for estimating replication completion time using machine learning techniques. An exemplary computer-implemented method includes obtaining, from one or more data deduplication storage systems, data related to one or more historical replication operations, and generating at least one curve fitting function by processing at least a portion of the obtained data using one or more machine learning techniques. The method also includes generating an estimate for completion time of at least one unexecuted replication operation associated with at least one of the one or more data deduplication storage systems by processing input data from the at least one data deduplication storage system using the at least one curve fitting function. Further, the method additionally includes performing one or more automated actions based at least in part on the generated estimate.

Illustrative embodiments can provide significant advantages relative to conventional replication completion estimation approaches. For example, problems associated with inaccurate estimation results arising from offline techniques lacking access to entire datasets are overcome in one or more embodiments through generating dynamic curve fitting functions for replication completion time estimations by processing data deduplication storage system data using machine learning techniques.

These and other illustrative embodiments described herein include, without limitation, methods, apparatus, systems, and computer program products comprising processor-readable storage media.

DETAILED DESCRIPTION

Illustrative embodiments will be described herein with reference to exemplary computer networks and associated computers, servers, network devices or other types of processing devices. It is to be appreciated, however, that these and other embodiments are not restricted to use with the particular illustrative network and device configurations shown. Accordingly, the term "computer network" as used herein is intended to be broadly construed, so as to encompass, for example, any system comprising multiple networked processing devices.

Figure 1:
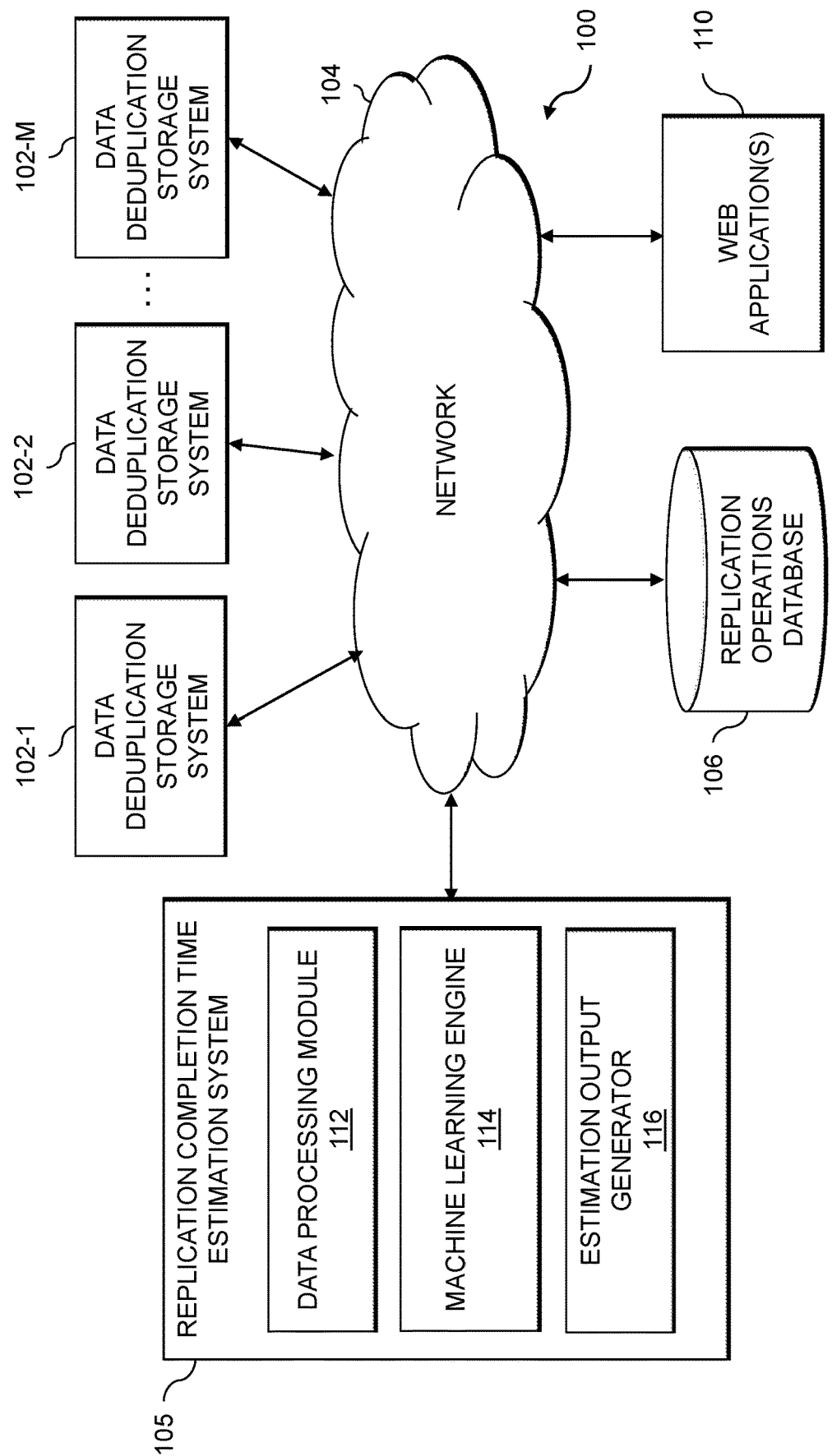
FIG. 1 shows an information processing system configured for estimating replication completion time using machine learning techniques in an illustrative embodiment.

FIG. 1 shows a computer network (also referred to herein as an information processing system) 100 configured in accordance with an illustrative embodiment. The computer network 100 comprises a plurality of data deduplication storage systems 102-1, 102-2, . . . 102-M, collectively referred to herein as data deduplication storage systems 102. The data deduplication storage systems 102 are coupled to a network 104, where the network 104 in this embodiment is assumed to represent a sub-network or other related portion of the larger computer network 100. Accordingly, elements 100 and 104 are both referred to herein as examples of "networks" but the latter is assumed to be a component of the former in the context of the FIG. 1 embodiment. Also coupled to network 104 is replication completion time estimation system 105 and one or more web applications 110 (e.g., planning applications and/or resource deployment applications associated with an enterprise related to one or more of the data deduplication storage systems 102).

The data deduplication storage systems 102 may comprise, for example, mobile telephones, laptop computers, tablet computers, desktop computers or other types of computing devices. Such devices are examples of what are more generally referred to herein as "processing devices." Some of these processing devices are also generally referred to herein as "computers." Additionally, data deduplication storage systems 102 may comprise a content addressable storage (CAS) system having a distributed storage controller. In some embodiments, at least one of the data deduplication storage systems 102 illustratively comprises a scale-out all-flash content addressable storage array such as an XtremIO™ storage array from Dell EMC of Hopkinton, Mass. A wide variety of other types of storage arrays can be used in implementing a given one of the data deduplication storage systems 102 in other embodiments, including by way of example one or more VNX®, VMAX®, Unity™ or PowerMax™ storage arrays, commercially available from Dell EMC. Additional or alternative types of storage products that can be used in implementing a given storage system in illustrative embodiments include software-defined storage, cloud storage, object-based storage and scale-out storage. Combinations of multiple ones of these and other storage types can also be used in implementing a given storage system in an illustrative embodiment.

The term "storage system" as used herein is therefore intended to be broadly construed, and should not be viewed as being limited to content addressable storage systems or flash-based storage systems. A given storage system as the term is broadly used herein can comprise, for example, network-attached storage (NAS), storage area networks (SANs), direct-attached storage (DAS) and distributed DAS, as well as combinations of these and other storage types, including software-defined storage.

The data deduplication storage systems 102 in some embodiments comprise respective processing devices associated with a particular company, organization or other enterprise. In addition, at least portions of the computer network 100 may also be referred to herein as collectively comprising an "enterprise network." Numerous other operating scenarios involving a wide variety of different types and arrangements of processing devices and networks are possible, as will be appreciated by those skilled in the art.

Also, it is to be appreciated that the term "user" in this context and elsewhere herein is intended to be broadly construed so as to encompass, for example, human, hardware, software or firmware entities, as well as various combinations of such entities.

The network 104 is assumed to comprise a portion of a global computer network such as the Internet, although other types of networks can be part of the computer network 100, including a wide area network (WAN), a local area network (LAN), a satellite network, a telephone or cable network, a cellular network, a wireless network such as a Wi-Fi or WiMAX network, or various portions or combinations of these and other types of networks. The computer network 100 in some embodiments therefore comprises combinations of multiple different types of networks, each comprising processing devices configured to communicate using internet protocol (IP) or other related communication protocols.

Additionally, the replication completion time estimation system 105 can have an associated database 106 (e.g., an auto-support database) configured to store data pertaining to replication operations data from data deduplication storage systems 102, which comprise, for example, data pertaining to pre-compression bytes sent, post-compression bytes sent, post-compression bytes remaining, pre-compression bytes remaining, compression ratio, replication throttle, network size, encryption status, data deduplication storage model, replication streams, etc.

The database 106 in the present embodiment is implemented using one or more storage systems associated with the replication completion time estimation system 105. Such storage systems can comprise any of a variety of different types of storage including NAS, SANs, DAS and distributed DAS, as well as combinations of these and other storage types, including software-defined storage.

Also associated with the replication completion time estimation system 105 can be input-output devices, which illustratively comprise keyboards, displays or other types of input-output devices in any combination. Such input-output devices can be used, for example, to support one or more user interfaces to the replication completion time estimation system 105, as well as to support communication between the replication completion time estimation system 105 and other related systems and devices not explicitly shown.

Also, the replication completion time estimation system 105 in the FIG. 1 embodiment is assumed to be implemented using at least one processing device. Each such processing device generally comprises at least one processor and an associated memory, and implements one or more functional modules for controlling certain features of the replication completion time estimation system 105.

More particularly, the replication completion time estimation system 105 in this embodiment can comprise a processor coupled to a memory and a network interface.

The processor illustratively comprises a microprocessor, a microcontroller, an application-specific integrated circuit (ASIC), a field-programmable gate array (FPGA) or other type of processing circuitry, as well as portions or combinations of such circuitry elements.

The memory illustratively comprises random access memory (RAM), read-only memory (ROM) or other types of memory, in any combination. The memory and other memories disclosed herein may be viewed as examples of what are more generally referred to as "processor-readable storage media" storing executable computer program code or other types of software programs.

One or more embodiments include articles of manufacture, such as computer-readable storage media. Examples of an article of manufacture include, without limitation, a storage device such as a storage disk, a storage array or an integrated circuit containing memory, as well as a wide variety of other types of computer program products. The term "article of manufacture" as used herein should be understood to exclude transitory, propagating signals. These and other references to "disks" herein are intended to refer generally to storage devices, including solid-state drives (SSDs), and should therefore not be viewed as limited in any way to spinning magnetic media. The network interface allows the replication completion time estimation system 105 to communicate over the network 104 with the data deduplication storage systems 102, and illustratively comprises one or more conventional transceivers.

The replication completion time estimation system 105 further comprises a data processing module 112, a machine learning engine 114, and an estimation output generator 116.

It is to be appreciated that this particular arrangement of modules 112, 114, and 116 illustrated in the replication completion time estimation system 105 of the FIG. 1 embodiment is presented by way of example only, and alternative arrangements can be used in other embodiments. For example, the functionality associated with modules 112, 114, and 116 in other embodiments can be combined into a single module, or separated across a larger number of modules. As another example, multiple distinct processors can be used to implement different ones of modules 112, 114, and 116 or portions thereof.

At least portions of modules 112, 114, and 116 may be implemented at least in part in the form of software that is stored in memory and executed by a processor.

It is to be understood that the particular set of elements shown in FIG. 1 for estimating replication completion time using machine learning techniques involving data deduplication storage systems 102 of computer network 100 is presented by way of illustrative example only, and in other embodiments additional or alternative elements may be used. Thus, another embodiment includes additional or alternative systems, devices and other network entities, as well as different arrangements of modules and other components.

An exemplary process utilizing modules 112, 114, and 116 of an example replication completion time estimation system 105 in computer network 100 will be described in more detail with reference to the flow diagram of FIG. 4.

Accordingly, at least one embodiment includes estimating replication completion time using machine learning techniques. As further detailed herein, an example embodiment includes implementing an estimation model, using regression techniques, that trains and learns incrementally, in an online fashion, and on a continuous basis, while adding no or little overhead to data deduplication storage systems. Such an embodiment includes updating at least one regression equation with each instance of incoming data using approximate linear time complexity and accuracy within at least one regret bound. With respect to complexity, the depth of a Mondrian forest is O(log n) for n trainings, and O(1) for each new update in a single node. Accordingly, in one or more embodiments, overall complexity is: O(log n)+ O(1)≅O(log n)<O(n).

Additionally or alternatively, one or more embodiments include using at least one aggregated Mondrian forest regressor. As used and further detailed herein, an aggregated Mondrian forest regressor refers to a variant of a random forest optimized for online settings and one or more large-scale datasets.

Also, at least one embodiment includes creating an historical database and storing at least a portion of such data in an at least one auto-support database. As used herein, "auto-support" refers to a feature in one or more data deduplication systems. If such a feature is enabled, "auto-support" data are sent to a system (e.g., replication completion time estimation system 105) and stored in one or more databases (e.g., replication operations database 106). Such a stored file contains a snapshot (over a predefined interval) of data deduplication system details at a user or customer site. Such details can include, for example, system health monitoring logs, storage growth information, operations such as replication, etc. As also used herein, a historical database is created on one or more data deduplication systems and contains predefined information to be collected. The historical data, once sent from a user or customer, can be referred to as auto-support data.

In at least one embodiment, at least one aggregated Mondrian forest regressor is used to obtain and/or generate at least one curve fitting function (e.g., a regression equation) which is updated with each instance of incoming data from one or more data deduplication storage systems. With respect to an example curve fitting function, for each new incoming data sample, new splits are generated to ensure that each leaf in the tree contains at most one point among the existing data points (including the new sample data) using the recursive property of a Mondrian partition. At least one embodiment also includes identifying a leaf contained in the partition that has already been updated, and updating the values of weight, average weight, and forecast for each node along an upwards recursion from current node to the root (of the tree).

Once an updated regression function is obtained and/or generated, the updated function is used to estimate completion time for at least one replication operation (e.g., as carried out by at least one user) on a given data deduplication storage system (as further detailed in connection with FIG. 3). Additionally, in such an embodiment, the determined completion time estimation is output to at least one user (for example, the estimation is displayed via a graphical user interface (GUI) associated with the given data deduplication storage system).

Figure 2:
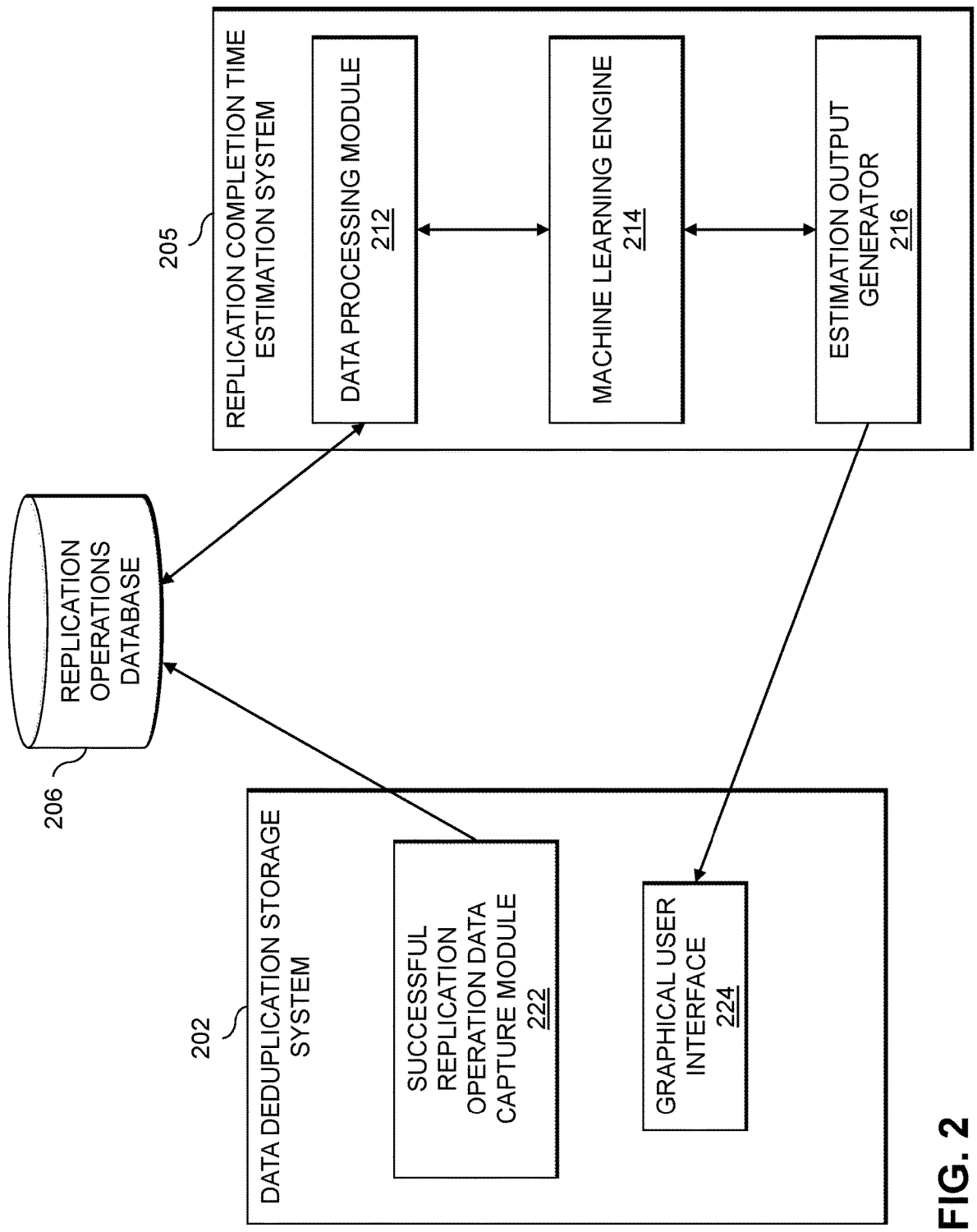
FIG. 2 shows an information processing system configured for estimating replication completion time using machine learning techniques in an illustrative embodiment.

FIG. 2 shows an information processing system configured for estimating replication completion time using machine learning techniques in an illustrative embodiment. By way of illustration, FIG. 2 depicts data deduplication storage system 202, which captures data from one or more successful replication operations via module 222 and provides such data to replication operations database 206. FIG. 2 also depicts replication complete time estimation system 205, which includes data processing module 212, machine learning engine 214, and estimation output generator 216. As illustrated in FIG. 2, the data processing module 212 pulls one or more required datasets from database 206 and provides at least a portion of the pulled dataset(s) to the machine learning engine 214. The machine learning engine 214 then performs one or more curve fitting methods to produce a regression equation by processing the provided data using an aggregated Mondrian forest regressor (for example, via an online learning technique). The resulting regressing equation is utilized by the estimation output generator 216 to estimate a completion time for a replication operation to be performed by the data deduplication storage system 202. The estimation output generator 216 then outputs the estimation to the graphical user interface 224 of the data deduplication storage system 202

As detailed herein, one or more embodiments include implementing data collection techniques. Such an embodiment can include creating and/or updating an historical database using the obtained and/or collected data, and storing at least a portion of such an historical database in at least one auto-support database. For example, such data to be obtained and/or collected and pushed to at least one auto-support database can include data pertaining to pre-compression bytes sent, post-compression bytes sent, post-compression bytes remaining, pre-compression bytes remaining, compression ratio, replication throttle, network size, encryption status, data deduplication storage model, replication streams, low bandwidth optimization (LBO) enablement, cloud enablement, etc.

In one or more embodiments, such variables (or a subset thereof) can be used and/or combined from source and destination entities in connection with at least one data deduplication storage system, and respective completion time estimations can be determined and/or generated as a Y variable for each successful replication. In at least one embodiment, data associated with failed replications are not stored in the historical database. Referring again to successful replications, a table or other data organization tool containing the variables (or subset thereof) can be translated to a regression problem as follows: $f(x_1, x_2, x_3, \ldots, x_{n-1}) \rightarrow Y$.

Also, one or more embodiments include implementing at least one decision tree-based regressor as an estimation model. In utilizing a decision tree-based regressor, one or more decisions and/or determinations carried out in connection with such an embodiment are transparent to a user. As detailed herein, such a decision tree-based regressor utilized by at least one embodiment includes an aggregated Mondrian forest regressor.

Aggregated Mondrian forests, as used in connection with one or more embodiments, utilize one or more Mondrian processes for creating decision trees, and implement at least one aggregation algorithm over at least portions of the pruning of the Mondrian partition(s). Additionally, the aggregated Mondrian forests used in connection with such embodiments include enabling capabilities of learning from new data and executing on a dynamic basis. By way of example, when a new data point becomes available, at least one embodiment includes updating at least one partition determination and updating at least one prediction function. As used herein, a partition update includes updating a decision tree structure based at least in part on new data in order to ensure that each leaf in the tree contains at most one point using the recursive property of Mondrian partitions. Also, a prediction function update includes updating the one or more prediction functions that are necessary for the completion time estimation computation, which aggregates the decision functions of the pruning of the decision tree.

As noted herein, at least one embodiment can include implementation in connection with large-scale datasets (e.g., billions of data points being written to auto-support per day). Additionally or alternatively, one or more embodiments can include executing an estimation engine (e.g., replication completion time estimation system 105 in the FIG. 1 embodiment) in at least one cloud-based environment, and providing a curve fitting function to one or more data deduplication storage systems when a replication estimation command line is called.

By way merely of example, an illustrative use case might include a user, before migrating data to a cloud from an active tier, seeking to estimate the total time required to complete the operation. Instead of using single system statistics for the estimation, an example embodiment can include creating a global function from systems with similar properties (e.g., cloud-tier enabled) and generating an estimate for the system in question. Such an estimation of the time required for an operation such as replication, before performance of the operation, can provide value to users, for example, in connection with planning and/or resource deployment. For instance, a user can utilize the estimation in determining whether to perform the operation at one or more given temporal instances, and when executed, the user can visualize operation via a data deduplication storage system GUI.

Figure 3:
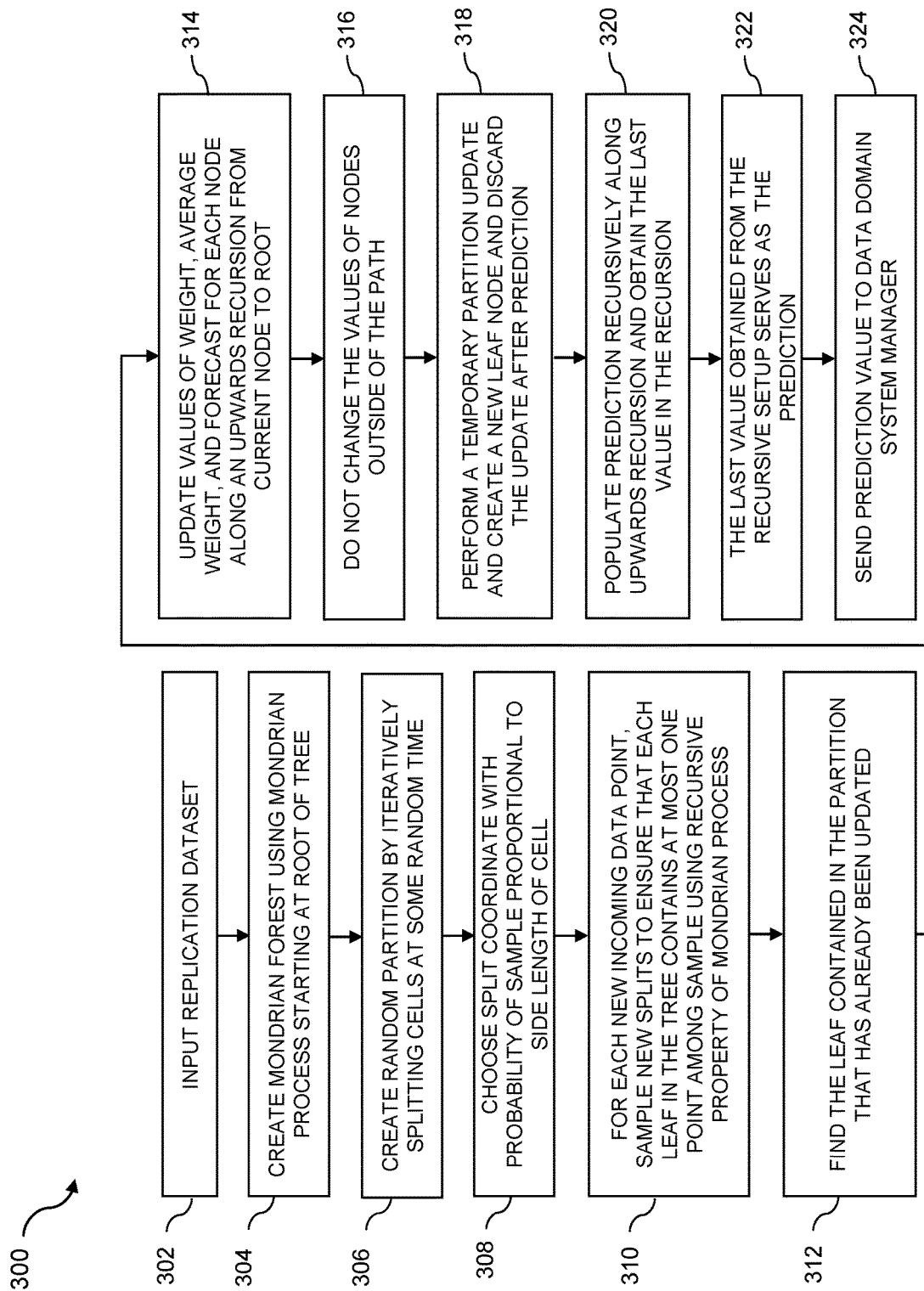
FIG. 3 shows example pseudocode for implementing at least a portion of an aggregated Mondrian forest algorithm in an illustrative embodiment.

FIG. 3 shows example pseudocode for implementing at least a portion of an aggregated Mondrian forest algorithm in an illustrative embodiment. In this embodiment, example pseudocode 300 is executed by or under the control of at least one processing system and/or device. For example, the example pseudocode 300 may be viewed as comprising a portion of a software implementation of at least part of replication completion time estimation system 105 of the FIG. 1 embodiment.

The example pseudocode 300 illustrates steps 302 through 324. Step 302 includes inputting a replication dataset. Step 304 includes creating a Mondrian forest using a Mondrian process starting at the root of a tree, step 306 includes creating at least one random partition by iteratively splitting cells at some random time, and step 308 includes selecting at least one split coordinate with a probability of sample proportional to the side length of the given cell(s). Steps 304, 306, and 308 encompass at least a portion of the Mondrian process.

Step 310 includes performing a partition update, whereby for each new incoming data point, new splits are sampled to ensure that each leaf in the tree contains at most one point among the sample using the recursive property of the Mondrian process. Step 312 includes identifying a leaf contained in the partition that has already been updated, and step 314 includes updating the values of weight, average weight, and/or forecast for each node along an upwards recursion from the current node to the root (of the tree). In step 316, the values of nodes outside of that path are not changed (or are precluded from being changed).

Step 318 includes performing a temporary partition update, creating a new leaf node, and discarding the update subsequent to a prediction being made. Step 320 includes populating the prediction recursively along an upwards recursion, and obtaining the last value in the recursion. In step 322, it is noted and/or determined that the last value in the recursion serves as the prediction value. Step 324 includes sending and/or outputting the prediction value to a data deduplication system manager.

It is to be appreciated that this particular example pseudocode shows just one example implementation of an aggregated Mondrian forest algorithm, and alternative implementations of the process can be used in other embodiments.

Figure 4:
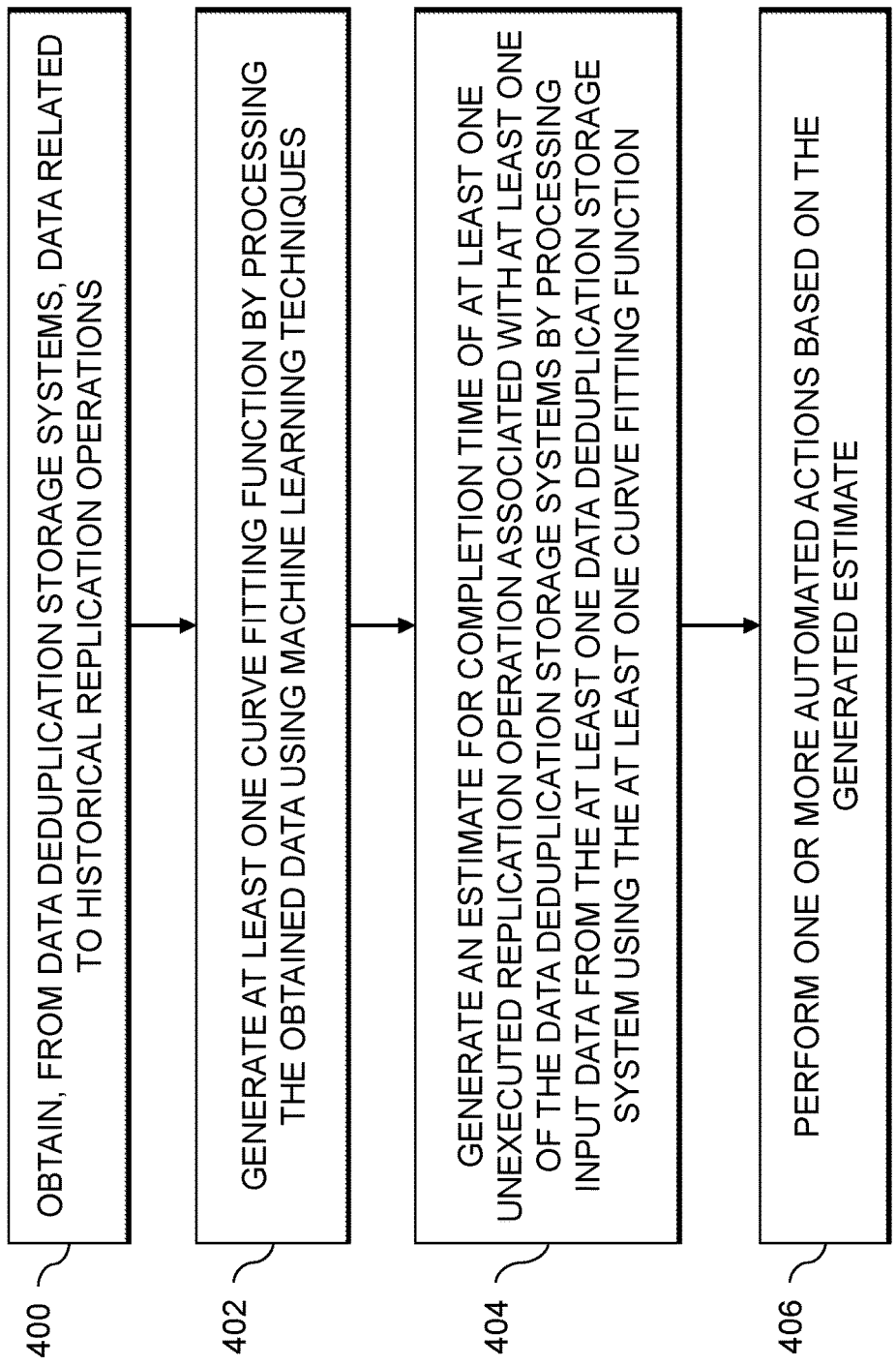
FIG. 4 is a flow diagram of a process for estimating replication completion time using machine learning techniques in an illustrative embodiment.

FIG. 4 is a flow diagram of a process for estimating replication completion time using machine learning techniques in an illustrative embodiment. It is to be understood that this particular process is only an example, and additional or alternative processes can be carried out in other embodiments.

In this embodiment, the process includes steps 400 through 406. These steps are assumed to be performed by the replication completion time estimation system 105 utilizing its modules 112, 114 and 116.

Step 400 includes obtaining, from one or more data deduplication storage systems, data related to one or more historical replication operations. In at least one embodiment, the data related to the one or more historical replication operations include values for multiple variables derived from one or more successful replication operations.

Step 402 includes generating at least one curve fitting function by processing at least a portion of the obtained data using one or more machine learning techniques. In at least one embodiment, generating the at least one curve fitting function includes generating at least one regression equation by processing at least a portion of the obtained data using an aggregated Mondrian forest algorithm. Also, in such an embodiment, processing the at least a portion of the obtained data using an aggregated Mondrian forest algorithm includes creating one or more decision trees by analyzing the at least a portion of the obtained data using one or more Mondrian processes, and implementing at least one aggregation algorithm over at least a portion of the one or more decision trees.

One or more embodiments additionally include updating the at least one curve fitting function by processing, using the one or more machine learning techniques, the at least a portion of the obtained data and one or more items of data related to at least one historical replication operation executed subsequent to the generating of the at least one curve function. In such an embodiment, updating the at least one curve fitting function includes updating at least a portion of one or more decision trees created by analyzing the at least a portion of the obtained data using the one or more machine learning techniques, wherein updating the at least a portion of the one or more decision trees includes ensuring that each leaf in the at least a portion of the one or more decision trees contains at most one data point. Additionally or alternatively, in at least one embodiment, updating the at least one curve fitting function includes updating a prediction function that aggregates one or more decision functions associated with the at least a portion of the one or more decision trees.

Step 404 includes generating an estimate for completion time of at least one unexecuted replication operation associated with at least one of the one or more data deduplication storage systems by processing input data from the at least one data deduplication storage system using the at least one curve fitting function.

Step 406 includes performing one or more automated actions based at least in part on the generated estimate. In at least one embodiment, performing the one or more automated actions can include outputting the generated estimate to the at least one data deduplication storage system via one or more graphical user interfaces and/or one or more command line interfaces. Additionally or alternatively, performing the one or more automated actions can include automatically executing the at least one unexecuted replication operation at a time determined based at least in part on the generated estimate.

Accordingly, the particular processing operations and other functionality described in conjunction with the flow diagram of FIG. 4 are presented by way of illustrative example only, and should not be construed as limiting the scope of the disclosure in any way. For example, the ordering of the process steps may be varied in other embodiments, or certain steps may be performed concurrently with one another rather than serially.

The above-described illustrative embodiments provide significant advantages relative to conventional approaches. For example, some embodiments are configured to generate dynamic curve fitting functions for replication completion time estimations by processing data deduplication storage system data using machine learning techniques. These and other embodiments can effectively overcome problems associated with inaccurate estimation results arising from offline techniques lacking access to entire datasets.

It is to be appreciated that the particular advantages described above and elsewhere herein are associated with particular illustrative embodiments and need not be present in other embodiments. Also, the particular types of information processing system features and functionality as illustrated in the drawings and described above are exemplary only, and numerous other arrangements may be used in other embodiments.

As mentioned previously, at least portions of the information processing system 100 can be implemented using one or more processing platforms. A given such processing platform comprises at least one processing device comprising a processor coupled to a memory. The processor and memory in some embodiments comprise respective processor and memory elements of a virtual machine or container provided using one or more underlying physical machines. The term "processing device" as used herein is intended to be broadly construed so as to encompass a wide variety of different arrangements of physical processors, memories and other device components as well as virtual instances of such components. For example, a "processing device" in some embodiments can comprise or be executed across one or more virtual processors. Processing devices can therefore be physical or virtual and can be executed across one or more physical or virtual processors. It should also be noted that a given virtual device can be mapped to a portion of a physical one.

Some illustrative embodiments of a processing platform used to implement at least a portion of an information processing system comprises cloud infrastructure including virtual machines implemented using a hypervisor that runs on physical infrastructure. The cloud infrastructure further comprises sets of applications running on respective ones of the virtual machines under the control of the hypervisor. It is also possible to use multiple hypervisors each providing a set of virtual machines using at least one underlying physical machine. Different sets of virtual machines provided by one or more hypervisors may be utilized in configuring multiple instances of various components of the system.

These and other types of cloud infrastructure can be used to provide what is also referred to herein as a multi-tenant environment. One or more system components, or portions thereof, are illustratively implemented for use by tenants of such a multi-tenant environment.

As mentioned previously, cloud infrastructure as disclosed herein can include cloud-based systems. Virtual machines provided in such systems can be used to implement at least portions of a computer system in illustrative embodiments.

In some embodiments, the cloud infrastructure additionally or alternatively comprises a plurality of containers implemented using container host devices. For example, as detailed herein, a given container of cloud infrastructure illustratively comprises a Docker container or other type of Linux Container (LXC). The containers are run on virtual machines in a multi-tenant environment, although other arrangements are possible. The containers are utilized to implement a variety of different types of functionality within the system 100. For example, containers can be used to implement respective processing devices providing compute and/or storage services of a cloud-based system. Again, containers may be used in combination with other virtualization infrastructure such as virtual machines implemented using a hypervisor.

Illustrative embodiments of processing platforms will now be described in greater detail with reference to FIGS. 5 and 6. Although described in the context of system 100, these platforms may also be used to implement at least portions of other information processing systems in other embodiments.

Figure 5:
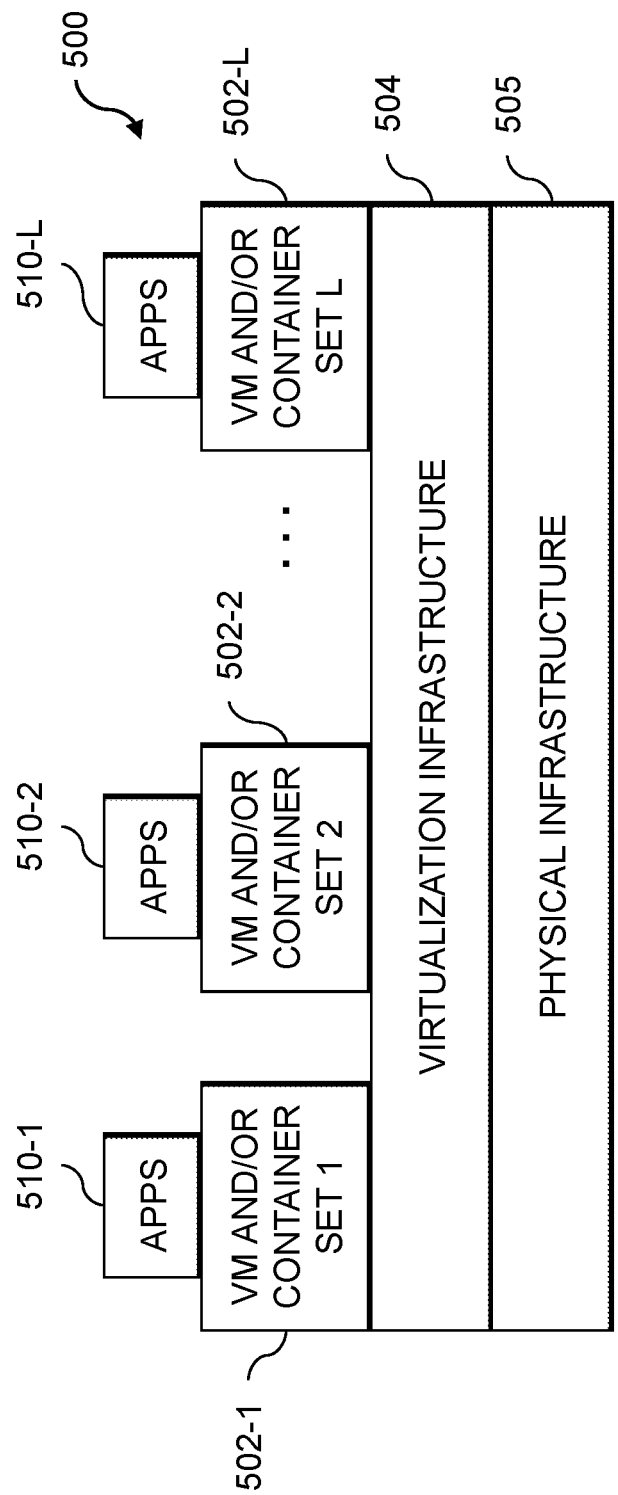
FIGS. 5 and 6 show examples of processing platforms that may be utilized to implement at least a portion of an information processing system in illustrative embodiments.
Figure 6:
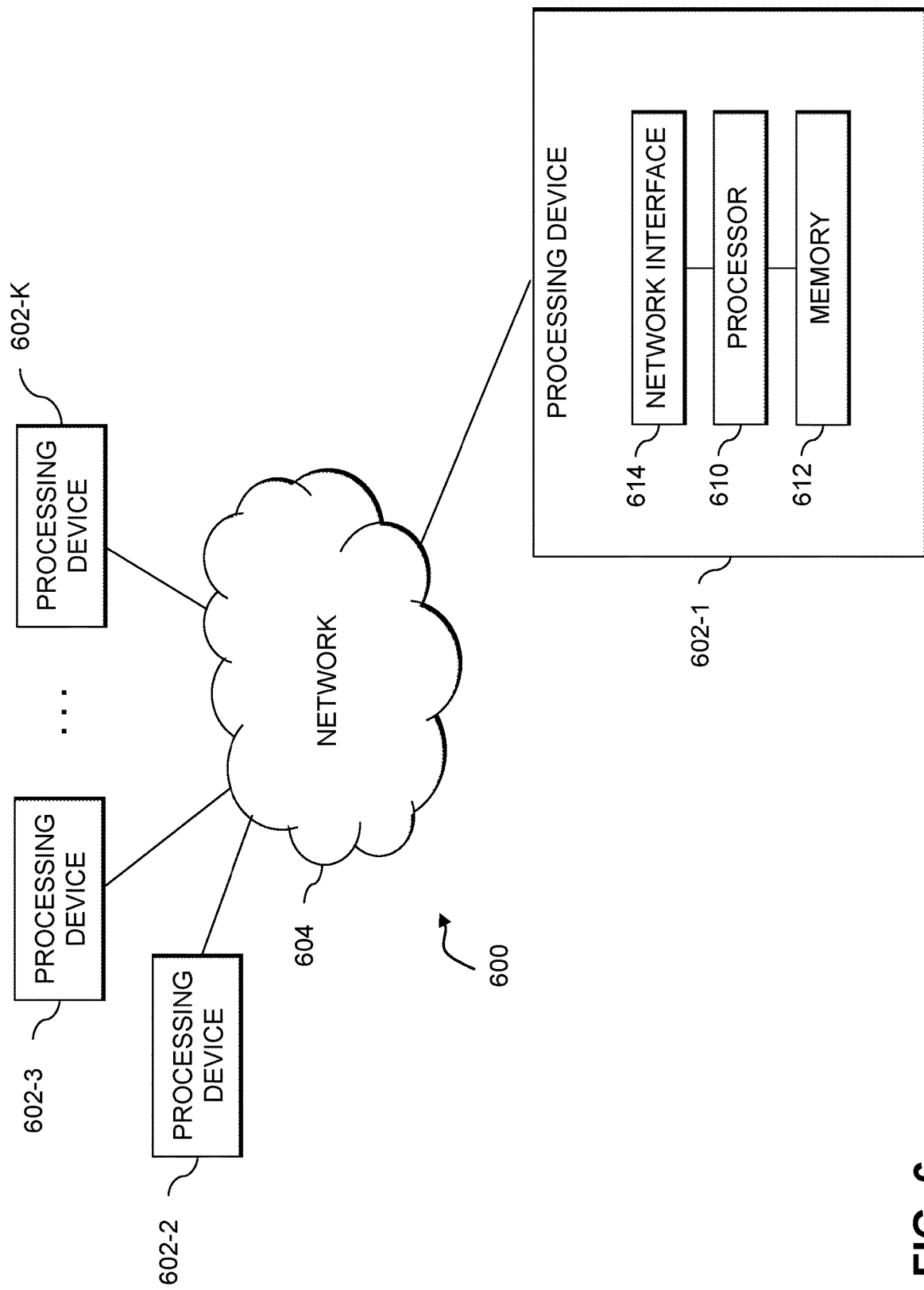

FIG. 5 shows an example processing platform comprising cloud infrastructure 500. The cloud infrastructure 500 comprises a combination of physical and virtual processing resources that are utilized to implement at least a portion of the information processing system 100. The cloud infrastructure 500 comprises multiple virtual machines (VMs) and/or container sets 502-1, 502-2, . . . 502-L implemented using virtualization infrastructure 504. The virtualization infrastructure 504 runs on physical infrastructure 505, and illustratively comprises one or more hypervisors and/or operating system level virtualization infrastructure. The operating system level virtualization infrastructure illustratively comprises kernel control groups of a Linux operating system or other type of operating system.

The cloud infrastructure 500 further comprises sets of applications 510-1, 510-2, . . . 510-L running on respective ones of the VMs/container sets 502-1, 502-2, . . . 502-L under the control of the virtualization infrastructure 504. The VMs/container sets 502 comprise respective VMs, respective sets of one or more containers, or respective sets of one or more containers running in VMs. In some implementations of the FIG. 5 embodiment, the VMs/container sets 502 comprise respective VMs implemented using virtualization infrastructure 504 that comprises at least one hypervisor.

A hypervisor platform may be used to implement a hypervisor within the virtualization infrastructure 504, wherein the hypervisor platform has an associated virtual infrastructure management system. The underlying physical machines comprise one or more distributed processing platforms that include one or more storage systems.

In other implementations of the FIG. 5 embodiment, the VMs/container sets 502 comprise respective containers implemented using virtualization infrastructure 504 that provides operating system level virtualization functionality, such as support for Docker containers running on bare metal hosts, or Docker containers running on VMs. The containers are illustratively implemented using respective kernel control groups of the operating system.

As is apparent from the above, one or more of the processing modules or other components of system 100 may each run on a computer, server, storage device or other processing platform element. A given such element is viewed as an example of what is more generally referred to herein as a "processing device." The cloud infrastructure 500 shown in FIG. 5 may represent at least a portion of one processing platform. Another example of such a processing platform is processing platform 600 shown in FIG. 6.

The processing platform 600 in this embodiment comprises a portion of system 100 and includes a plurality of processing devices, denoted 602-1, 602-2, 602-3, . . . 602-K, which communicate with one another over a network 604.

The network 604 comprises any type of network, including by way of example a global computer network such as the Internet, a WAN, a LAN, a satellite network, a telephone or cable network, a cellular network, a wireless network such as a Wi-Fi or WiMAX network, or various portions or combinations of these and other types of networks.

The processing device 602-1 in the processing platform 600 comprises a processor 610 coupled to a memory 612.

The processor 610 comprises a microprocessor, a microcontroller, an application-specific integrated circuit (ASIC), a field-programmable gate array (FPGA) or other type of processing circuitry, as well as portions or combinations of such circuitry elements.

The memory 612 comprises random access memory (RAM), read-only memory (ROM) or other types of memory, in any combination. The memory 612 and other memories disclosed herein should be viewed as illustrative examples of what are more generally referred to as "processor-readable storage media" storing executable program code of one or more software programs.

Articles of manufacture comprising such processor-readable storage media are considered illustrative embodiments. A given such article of manufacture comprises, for example, a storage array, a storage disk or an integrated circuit containing RAM, ROM or other electronic memory, or any of a wide variety of other types of computer program products. The term "article of manufacture" as used herein should be understood to exclude transitory, propagating signals. Numerous other types of computer program products comprising processor-readable storage media can be used.

Also included in the processing device 602-1 is network interface circuitry 614, which is used to interface the processing device with the network 604 and other system components, and may comprise conventional transceivers.

The other processing devices 602 of the processing platform 600 are assumed to be configured in a manner similar to that shown for processing device 602-1 in the figure.

Again, the particular processing platform 600 shown in the figure is presented by way of example only, and system 100 may include additional or alternative processing platforms, as well as numerous distinct processing platforms in any combination, with each such platform comprising one or more computers, servers, storage devices or other processing devices.

For example, other processing platforms used to implement illustrative embodiments can comprise different types of virtualization infrastructure, in place of or in addition to virtualization infrastructure comprising virtual machines. Such virtualization infrastructure illustratively includes container-based virtualization infrastructure configured to provide Docker containers or other types of LXCs.

As another example, portions of a given processing platform in some embodiments can comprise converged infrastructure.

It should therefore be understood that in other embodiments different arrangements of additional or alternative elements may be used. At least a subset of these elements may be collectively implemented on a common processing platform, or each such element may be implemented on a separate processing platform.

Also, numerous other arrangements of computers, servers, storage products or devices, or other components are possible in the information processing system 100. Such components can communicate with other elements of the information processing system 100 over any type of network or other communication media.

For example, particular types of storage products that can be used in implementing a given storage system of a distributed processing system in an illustrative embodiment include all-flash and hybrid flash storage arrays, scale-out all-flash storage arrays, scale-out NAS clusters, or other types of storage arrays. Combinations of multiple ones of these and other storage products can also be used in implementing a given storage system in an illustrative embodiment.

It should again be emphasized that the above-described embodiments are presented for purposes of illustration only. Many variations and other alternative embodiments may be used. Also, the particular configurations of system and device elements and associated processing operations illustratively shown in the drawings can be varied in other embodiments. Thus, for example, the particular types of processing devices, modules, systems and resources deployed in a given embodiment and their respective configurations may be varied. Moreover, the various assumptions made above in the course of describing the illustrative embodiments should also be viewed as exemplary rather than as requirements or limitations of the disclosure. Numerous other alternative embodiments within the scope of the appended claims will be readily apparent to those skilled in the art.

What is claimed is:

1. A computer-implemented method comprising:
obtaining, from one or more data deduplication storage systems, data related to one or more historical replication operations;
generating at least one curve fitting function by processing at least a portion of the obtained data using one or more machine learning techniques;
generating an estimate for completion time of at least one unexecuted replication operation associated with at least one of the one or more data deduplication storage systems by processing input data from the at least one data deduplication storage system using the at least one curve fitting function; and
performing one or more automated actions based at least in part on the generated estimate;

wherein the method is performed by at least one processing device comprising a processor coupled to a memory.

2. The computer-implemented method of claim 1, wherein generating the at least one curve fitting function comprises generating at least one regression equation by processing at least a portion of the obtained data using an aggregated Mondrian forest algorithm.

3. The computer-implemented method of claim 2, wherein processing the at least a portion of the obtained data using an aggregated Mondrian forest algorithm comprises:
  creating one or more decision trees by analyzing the at least a portion of the obtained data using one or more Mondrian processes; and
  implementing at least one aggregation algorithm over at least a portion of the one or more decision trees.

4. The computer-implemented method of claim 1, further comprising:
  updating the at least one curve fitting function by processing, using the one or more machine learning techniques, the at least a portion of the obtained data and one or more items of data related to at least one historical replication operation executed subsequent to the generating of the at least one curve function.

5. The computer-implemented method of claim 4, wherein updating the at least one curve fitting function comprises updating at least a portion of one or more decision trees created by analyzing the at least a portion of the obtained data using the one or more machine learning techniques, wherein updating the at least a portion of the one or more decision trees comprises ensuring that each leaf in the at least a portion of the one or more decision trees contains at most one data point.

6. The computer-implemented method of claim 5, wherein updating the at least one curve fitting function comprises updating a prediction function that aggregates one or more decision functions associated with the at least a portion of the one or more decision trees.

7. The computer-implemented method of claim 1, wherein the data related to one or more historical replication operations comprise values for multiple variables derived from one or more successful replication operations.

8. The computer-implemented method of claim 1, wherein performing the one or more automated actions comprises outputting the generated estimate to the at least one data deduplication storage system via one or more graphical user interfaces.

9. The computer-implemented method of claim 1, wherein performing the one or more automated actions comprises outputting the generated estimate to the at least one data deduplication storage system via one or more command line interfaces.

10. The computer-implemented method of claim 1, wherein performing the one or more automated actions comprises automatically executing the at least one unexecuted replication operation at a time determined based at least in part on the generated estimate.

11. A non-transitory processor-readable storage medium having stored therein program code of one or more software programs, wherein the program code when executed by at least one processing device causes the at least one processing device:
  to obtain, from one or more data deduplication storage systems, data related to one or more historical replication operations;
  to generate at least one curve fitting function by processing at least a portion of the obtained data using one or more machine learning techniques;
  to generate an estimate for completion time of at least one unexecuted replication operation associated with at least one of the one or more data deduplication storage systems by processing input data from the at least one data deduplication storage system using the at least one curve fitting function; and
  to perform one or more automated actions based at least in part on the generated estimate.

12. The non-transitory processor-readable storage medium of claim 11, wherein generating the at least one curve fitting function comprises generating at least one regression equation by processing at least a portion of the obtained data using an aggregated Mondrian forest algorithm.

13. The non-transitory processor-readable storage medium of claim 12, wherein processing the at least a portion of the obtained data using an aggregated Mondrian forest algorithm comprises:
  creating one or more decision trees by analyzing the at least a portion of the obtained data using one or more Mondrian processes; and
  implementing at least one aggregation algorithm over at least a portion of the one or more decision trees.

14. The non-transitory processor-readable storage medium of claim 11, wherein the program code when executed by the at least one processing device causes the at least one processing device:
  to update the at least one curve fitting function by processing, using the one or more machine learning techniques, the at least a portion of the obtained data and one or more items of data related to at least one historical replication operation executed subsequent to the generating of the at least one curve function.

15. The non-transitory processor-readable storage medium of claim 14, wherein updating the at least one curve fitting function comprises updating at least a portion of one or more decision trees created by analyzing the at least a portion of the obtained data using the one or more machine learning techniques, wherein updating the at least a portion of the one or more decision trees comprises ensuring that each leaf in the at least a portion of the one or more decision trees contains at most one data point.

16. An apparatus comprising:
  at least one processing device comprising a processor coupled to a memory;
  the at least one processing device being configured:
    to obtain, from one or more data deduplication storage systems, data related to one or more historical replication operations;
    to generate at least one curve fitting function by processing at least a portion of the obtained data using one or more machine learning techniques;
    to generate an estimate for completion time of at least one unexecuted replication operation associated with at least one of the one or more data deduplication storage systems by processing input data from the at least one data deduplication storage system using the at least one curve fitting function; and
    to perform one or more automated actions based at least in part on the generated estimate.

17. The apparatus of claim 16, wherein generating the at least one curve fitting function comprises generating at least one regression equation by processing at least a portion of the obtained data using an aggregated Mondrian forest algorithm.

18. The apparatus of claim 17, wherein processing the at least a portion of the obtained data using an aggregated Mondrian forest algorithm comprises:
creating one or more decision trees by analyzing the at least a portion of the obtained data using one or more Mondrian processes; and
implementing at least one aggregation algorithm over at least a portion of the one or more decision trees.

19. The apparatus of claim 16, wherein the at least one processing device is further configured:
to update the at least one curve fitting function by processing, using the one or more machine learning techniques, the at least a portion of the obtained data and one or more items of data related to at least one historical replication operation executed subsequent to the generating of the at least one curve function.

20. The apparatus of claim 19, wherein updating the at least one curve fitting function comprises updating at least a portion of one or more decision trees created by analyzing the at least a portion of the obtained data using the one or more machine learning techniques, wherein updating the at least a portion of the one or more decision trees comprises ensuring that each leaf in the at least a portion of the one or more decision trees contains at most one data point.

* * * * *